United States Patent
Ao et al.

(10) Patent No.: US 6,292,059 B1
(45) Date of Patent: Sep. 18, 2001

(54) SYSTEMS, METHODS, AND CIRCUITS FOR PROVIDING THERMAL COMPENSATION IN AMPLIFIERS

(75) Inventors: Jiening Ao, Suwanne; Herman A. Kruse, Winder, both of GA (US)

(73) Assignee: Scientific-Atlanta, Inc., Lawrenceville, GA (US)

( * ) Notice: Subject to any disclaimer, the term of this patent is extended or adjusted under 35 U.S.C. 154(b) by 0 days.

(21) Appl. No.: 09/430,080

(22) Filed: Oct. 29, 1999

(51) Int. Cl.$^7$ .................................................. H03G 3/20
(52) U.S. Cl. ................................... 330/289; 330/284
(58) Field of Search ..................................... 330/284, 289

(56) References Cited

U.S. PATENT DOCUMENTS

| | | | |
|---|---|---|---|
| 4,485,349 | * 11/1984 | Siegle et al. | 330/284 X |
| 5,177,453 | * 1/1993 | Russell et al. | 330/284 |
| 6,052,031 | * 4/2000 | Ao et al. | 330/289 |

* cited by examiner

*Primary Examiner*—Steven J. Mottola
(74) *Attorney, Agent, or Firm*—Shelley L. Couturier; Hubert J. Barnhardt III; Kenneth M. Massaroni

(57) ABSTRACT

A communication system (300) includes amplifiers (325) having an improved thermal response. The amplifiers (325) include a Bode circuit (208) for attenuating the signals and a thermal compensation circuit (320) for adjusting the gain in response to changes in temperature. The thermal compensation unit (320) provides a non-linear impedance to offset for the non-linear performance of the amplifiers gain versus control current. The thermal compensation unit (320) has circuit paths that are selectively turned on to provide the non-linear relationship of impedance versus input control voltage.

20 Claims, 7 Drawing Sheets

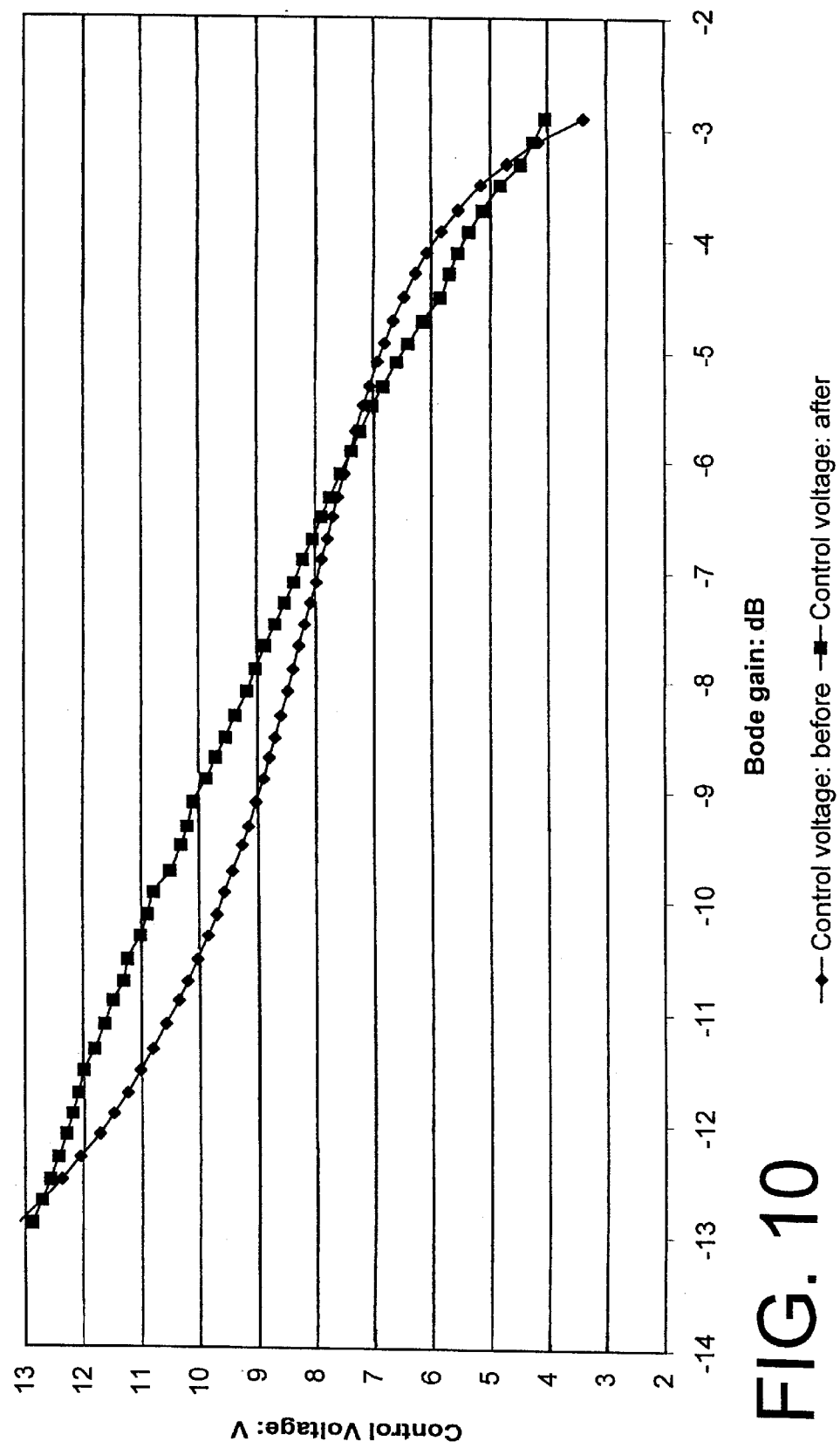

SYSTEMS, METHODS, AND CIRCUITS FOR PROVIDING THERMAL COMPENSATION IN AMPLIFIERS

FIELD OF THE INVENTION

This invention relates generally to systems, methods, and circuits for amplifying and, more specifically, to systems, methods, and circuits for providing thermal compensation in amplifiers.

BACKGROUND OF THE INVENTION

Communication systems are used to transmit and deliver information to consumers in a variety of ways. These systems include satellite, cellular, and wireline networks and the information can be virtually anything, from analog to digital thereby incorporating telephony, video, data, etc. Due to signal losses inherent in the transmission of signals over great distances, amplifiers are often necessary to boost the signal level. The amplifiers ensure that signals are at the proper power level as they pass through and out of the network.

Maintaining the signals at a constant power level is important for many systems, such as video distribution systems. For cable distribution systems, if the power signal level is either too high or too low, the reception at the customer's premises will be affected. If the power signal level is too high, the signal becomes saturated and the picture is distorted. On the other hand, when the power level is too low, the signal to noise ratio drops and the picture will have poor reception. The cable distribution systems consequently need to carefully monitor the power level of the signals and make appropriate adjustments.

The performance of a communication system, such as a cable distribution network, is affected by temperature. The lines that carry the signals have losses that vary with temperature. In addition to the lines, the performance of amplifiers within a communication system varies with the temperature. A cable distribution system is especially sensitive to temperature changes since the amplifiers and the coaxial cable are at ambient temperature, which can fluctuate greatly during a day or seasonally. Some communication systems consequently have to be operable over a range of temperatures from −40° C. to +60° C.

An example of a communication system 100 is shown in FIG. 1. The communication system 100 includes headend equipment 105 for generating forward signals that are transmitted in the downstream direction along a communication medium, such as a fiber optic cable 110, to an optical node 115 that converts optical signals to radio frequency (RF) signals. The RF signals are further transmitted along another communication medium, such as coaxial cable 120, and are amplified, as necessary, by one or more distribution amplifiers 125 positioned along the communication medium. Taps 130 included in the cable television system 100 split off portions of the forward signals for provision to subscriber equipment 135, such as set-top terminals, computers, and televisions. In a two-way system, the subscriber equipment 135 can also generate reverse signals that are transmitted upstream, amplified by any distribution amplifiers 125, converted to optical signals, and provided to the headend equipment 105.

A simplified diagram of the amplifier 125 is shown in FIG. 2. As discussed above, the gain of the amplifier 125 is affected by temperature and the impedance of the lines, such as coaxial cable 120, also varies with temperature. The output of the amplifier 125 should remain at a constant level to provide desired signal levels to the subscriber equipment 135. In order to provide a constant output of power at the amplifier 125, the amplifier 125 performs some adjustment based on temperature.

A conventional approach for providing for thermal compensation in an amplifier 125 is shown in FIG. 2. With reference to this figure, signals from the coaxial cable 120 are first passed through a pre-amplifier 206 to boost the signal level. The amplifier 125 also includes one or more gain stages 210 for amplifying the signals to the desired power level. To adjust for temperature, the amplifier 125 includes a variable attenuator, such as a Bode circuit 208 coupled to a thermal compensation circuit 220. The Bode circuit 208 is controlled by the thermal compensation circuit 220 so that the output of the Bode circuit 208, and consequently the output of the gain stages 210, is at a desired power level.

The operation of the thermal compensation circuit 220 will be described in greater detail with reference to FIG. 3. The thermal compensation circuit 220 includes a thermistor voltage reference circuit 222, a resistor 224, and a current mirror 226. The thermistor voltage reference circuit 222 outputs a voltage that varies with the temperature. The thermistor voltage reference circuit 222 typically is comprised of a resistor ladder and a thermistor placed in the ladder. The voltage from the thermistor voltage reference circuit 222 is converted into a current by the resistor 224 and this current is input to the current mirror 226 as a control signal. As the temperature changes, the voltage output by the thermistor voltage reference circuit 222 changes as does the current supplied to the current mirror 226. The magnitude of the currents supplied to the Bode circuit 208 from the current mirror 226 therefore vary with the temperature. The Bode circuit 208 attenuates the signals received from the pre-amplifier 206 to a level determined by the currents received from the current mirror 226. Thus, changes in temperature detected by the thermistor voltage reference circuit 222 can be used to alter the amount of attenuation provided by the Bode circuit 208.

Despite the use of the Bode circuit 208 and the thermal compensation circuit 220, conventional amplifiers, such as amplifier 125, output at power levels that fluctuate with temperature. For instance, some amplifiers with thermal compensation still have fluctuations of ±1 dB. A need therefore exists for improved methods, systems, and circuits for providing thermal compensation in amplifiers.

BRIEF DESCRIPTION OF THE DRAWINGS

The accompanying drawings, which are incorporated in and form a part of the specification, illustrate preferred embodiments of the present invention and, together with the description, disclose the principles of the invention. In the drawings:

FIG. 10 is a plot of control voltage versus gain, showing an improved thermal response for the amplifier of FIG. 5.

DETAILED DESCRIPTION

Reference will now be made in detail to preferred embodiments of the invention, non-limiting examples of which are illustrated in the accompanying drawings.

Figure 4:
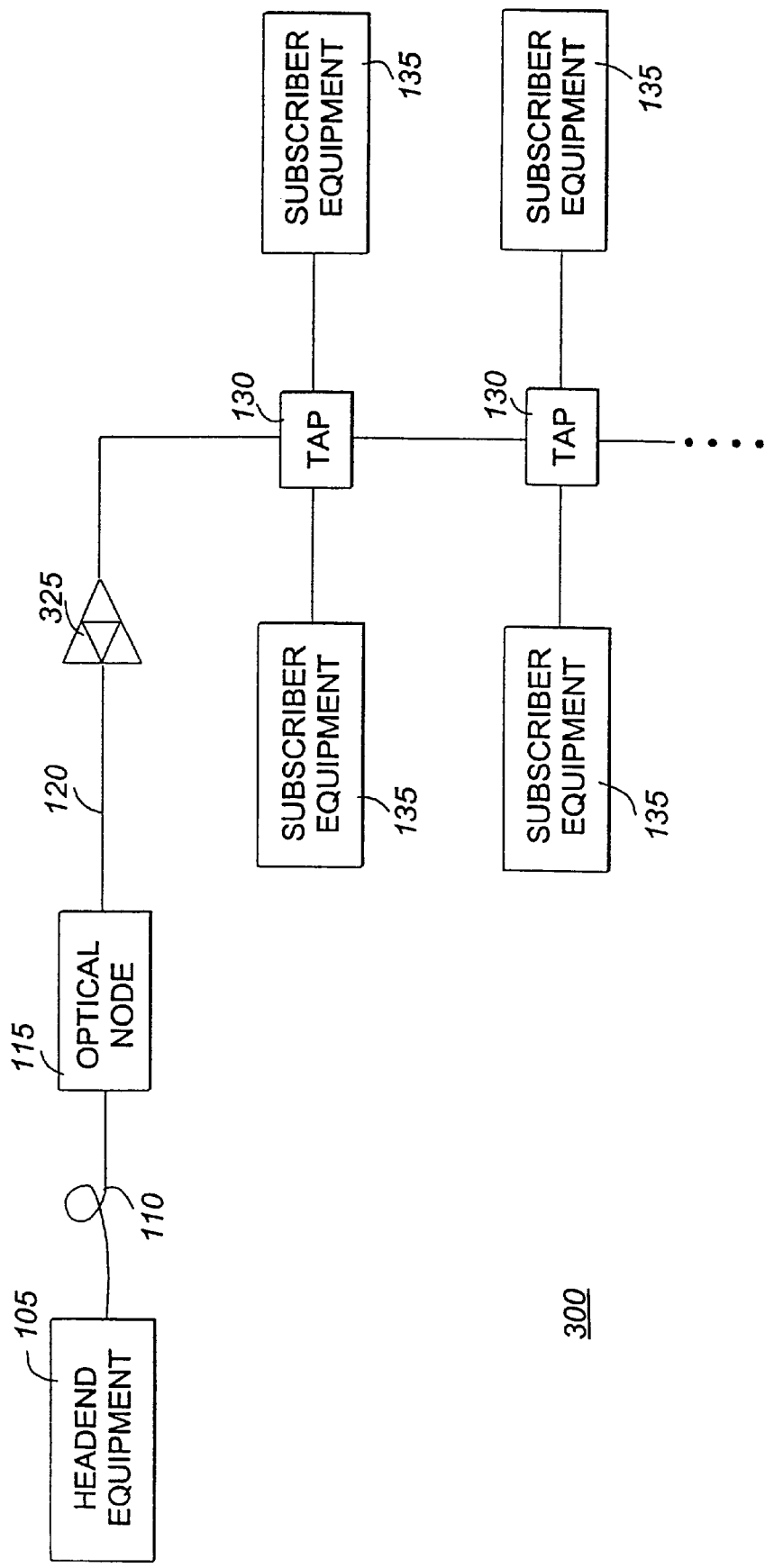
FIG. 4 is a block diagram of a communication system, such as a cable television system, according to a preferred embodiment of the invention.

With reference to FIG. 4, a communication system 300 according to a preferred embodiment of the invention includes headend equipment 105, optical nodes 115, taps 130, and subscriber equipment 135. The headend equipment 105 is for generating forward signals transmitted in the downstream direction along a communication medium which is preferably the optic cable 110. The optical nodes 115 convert the optical signals to RF signals and transmit them along a communication medium which is preferably the coaxial cable 120. One or more amplifiers 325 are positioned along the cable 120, as necessary, to amplify the signals. The taps 130 split off portions of the forward signals to the subscriber equipment 135, such as set-top terminals, computers, and televisions. The communication system is preferably, but not necessarily, a two-way system in which reverse signals are transmitted upstream, amplified by the amplifiers 325, converted to optical signals, and provided to the headend equipment 105.

Figure 1:
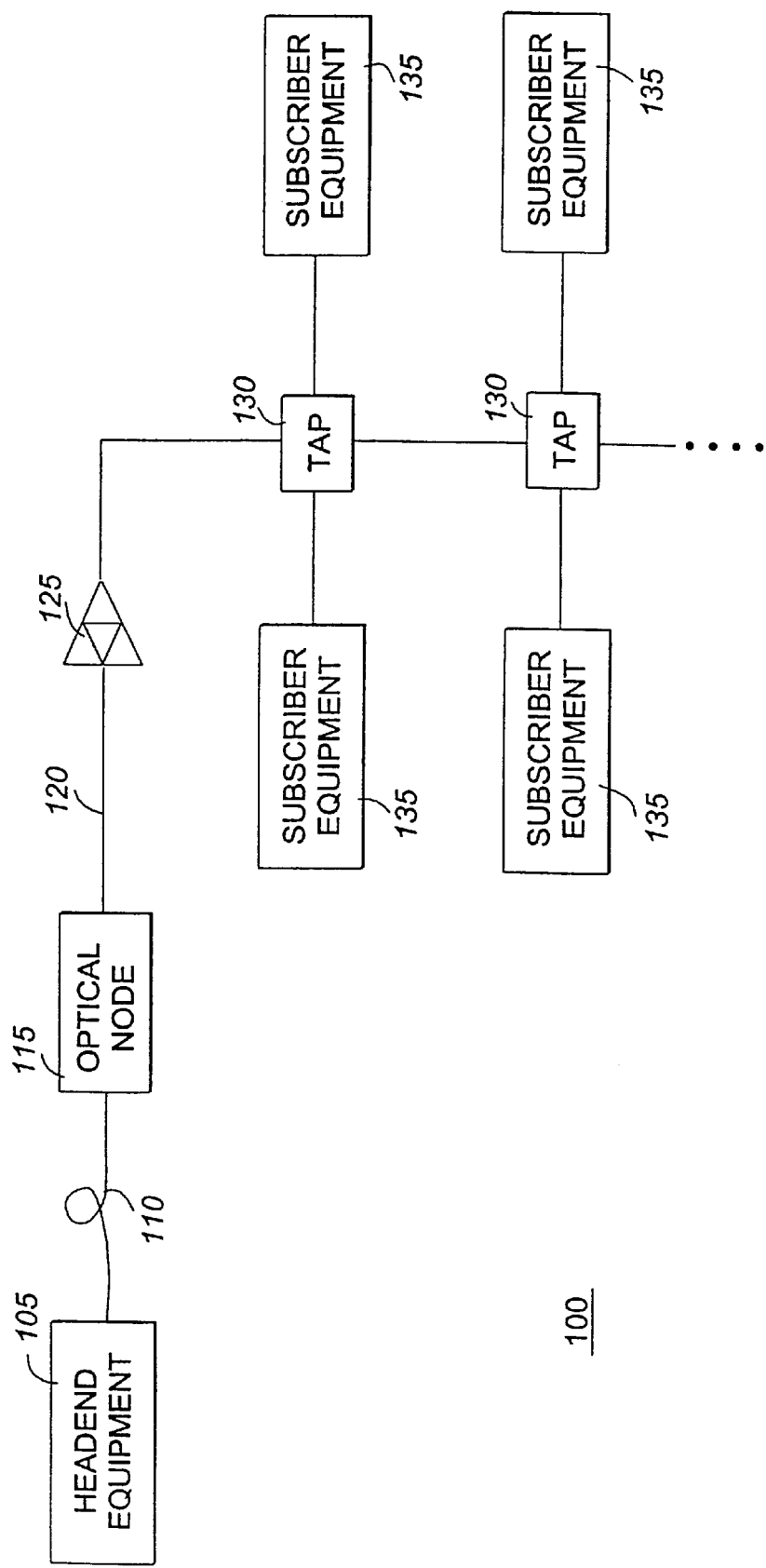
FIG. 1 is a block diagram of a conventional communication system, such as a cable television system.

The communication system 300 differs from the communication system 100 shown in FIG. 1 in that the system 300 includes amplifiers 325 having an improved thermal response. The improved thermal response of the amplifiers 325 will be described below in more detail. In general, however, the amplifiers 325 have a typical thermal accuracy of ±0.5 dB, which is a significant improvement over the typical thermal accuracy of ±1 dB of conventional amplifiers.

Figure 2:
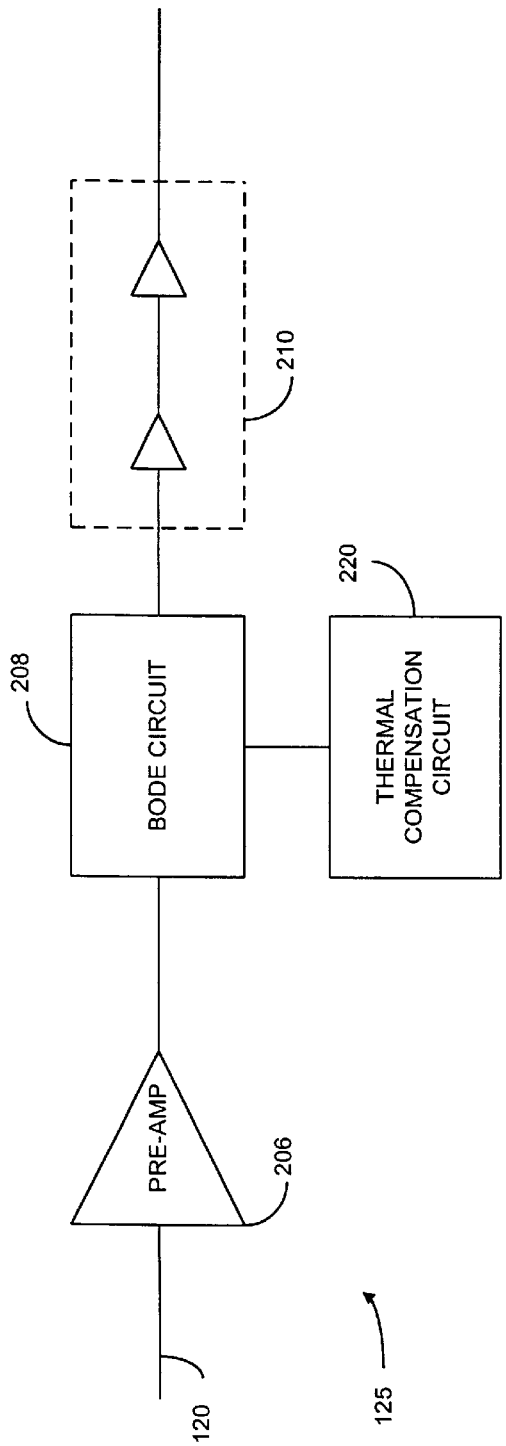
FIG. 2 is a block diagram of an amplifier included in the communication system of FIG. 1.
Figure 5:
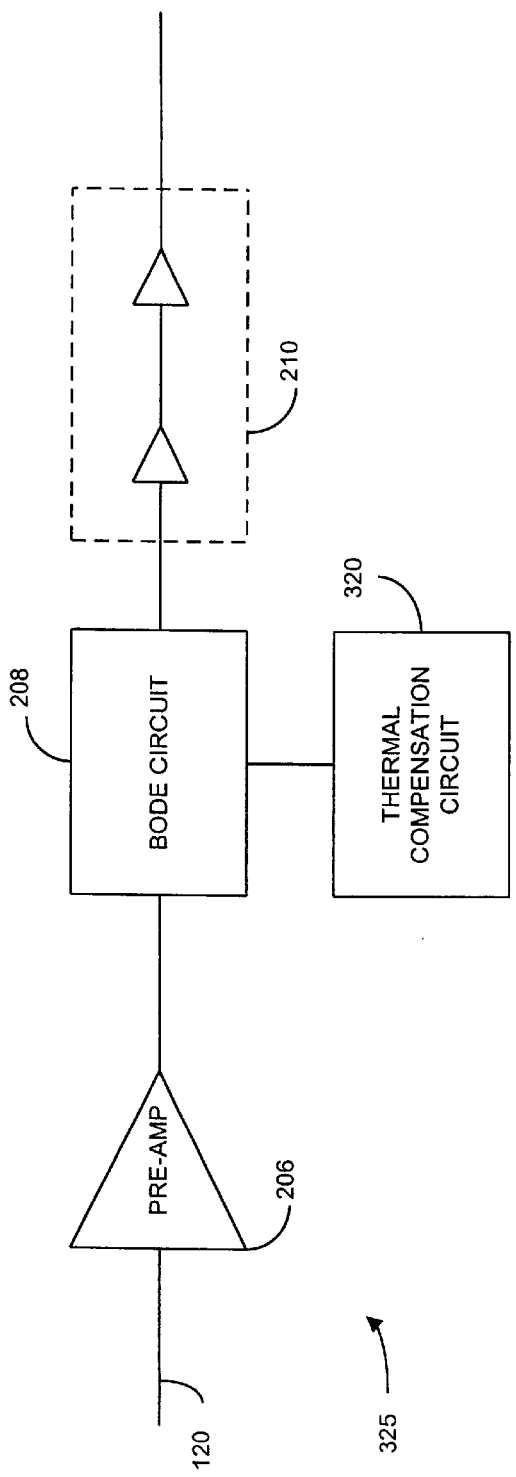
FIG. 5 is a block diagram of an amplifier in the communication system of FIG. 4.

A block diagram of the amplifier 325 is shown in FIG. 5. The amplifier 325 includes the pre-amplifier 206, a variable attenuator 208, which is preferably the Bode circuit, and one or more gain stages 210. The amplifier 325 also includes a thermal compensation circuit 320 for causing the power level of the amplifier 325 to be maintained at a fairly constant level regardless of changes in temperature. The description below provides additional details on the thermal compensation circuit 320 and how it differs from the thermal compensation circuit 220 shown in FIG. 2.

Figure 6:
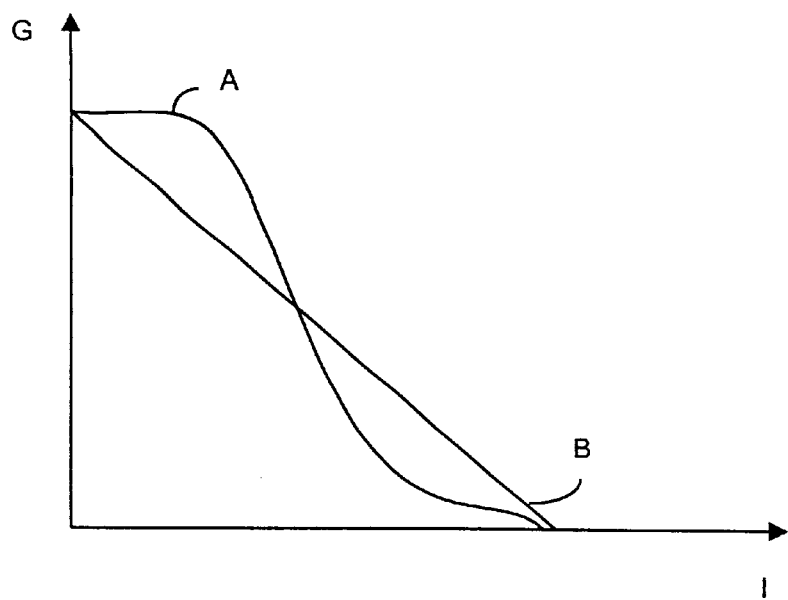
FIG. 6 is a plot of the gain of the amplifier of FIG. 5 versus control current.

As shown in FIG. 6 with the plot labeled as A, the gain of the Bode circuit 208 as a function of the input control current is non-linear. The control current, which is the current supplied to the Bode circuit 208, has a range of −10 mA to +10 mA. Thus, the control current will have a value of +10 mA at approximately −40° C. and will have a value of approximately −10 mA of a temperature of 60° C. The gain is not constant throughout this range but instead has a maximum at −10 mA and drops off approximately 7 dB at +10 mA. The gain at the +10 mA control current is therefore approximately 7 dB lower than the gain at the −10 mA control current.

A plot of the ideal gain versus control current plot is also shown in FIG. 6 and is labeled as B. The ideal plot B is a linear relationship between the gain and the control current over the entire 20 mA range of control current. Because the actual plot is non-linear, the gain from approximately −10 mA to 0 mA is above the desired level whereas the gain from approximately 0 mA to +10 mA is too low.

The thermal compensation circuit 320 functions so as to adjust the control current to an appropriate level so that the power output by the amplifier 325 remains relatively constant over the operating range of temperatures. In the preferred embodiment, the thermal compensation circuit 320 performs this function by presenting a non-linear impedance to the reference voltage. Because the impedance is non-linear, the control current output by the thermal compensation circuit 320, and thus the control current, also takes on a non-linear relationship with temperature. This non-linear relationship for the control current offsets the non-linear Bode gain relationship so that the overall response of the amplifier 325 is more linear over the operating range of temperatures.

Figure 7:
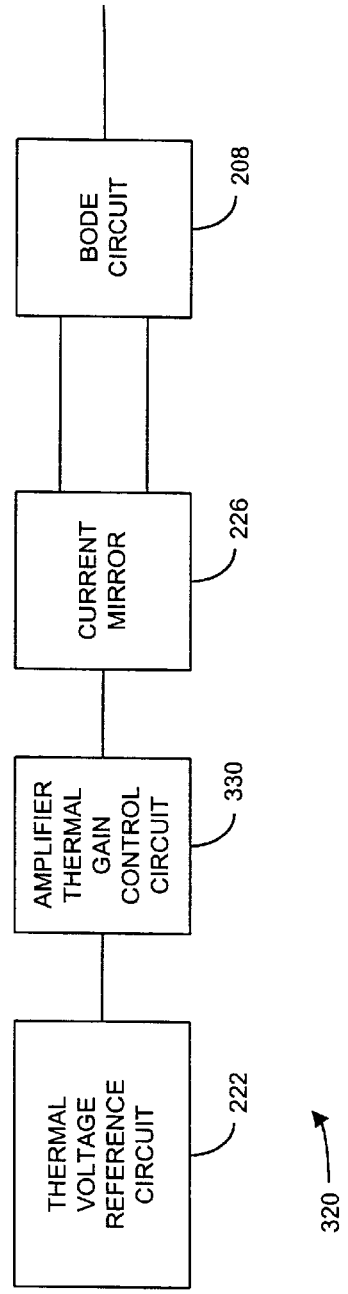
FIG. 7 is a block diagram of a thermal compensation circuit according to a preferred embodiment of the invention for use in the amplifier of FIG. 5.

As shown in more detail in FIG. 7, the thermal compensation unit 320 includes the thermal voltage reference circuit 222, which typically includes a resistor ladder having a thermistor. The thermal voltage reference circuit 222 outputs a voltage having a magnitude that represents the current temperature. The thermal voltage reference circuit 222 is essentially linear in that changes in temperature are reflected by proportional changes in the reference voltage.

The thermal compensation circuit 320 includes an amplifier thermal gain control circuit 330 that converts the voltage signal from the thermal voltage reference circuit 222 into a current. The amplifier thermal gain control circuit 330 has a non-linear relationship between the reference voltage and its impedance which, as discussed above, offsets the non-linear relationship between the Bode gain and control current. The amplifier thermal gain control circuit 330 outputs the control current to the current mirror 226 which then provides complementary current signals for driving the Bode circuit 208.

Figure 3:
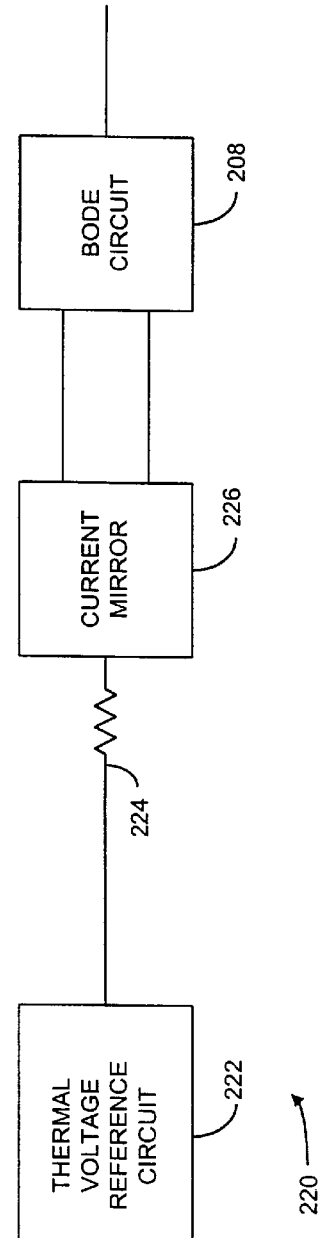
FIG. 3 is a block diagram of a thermal compensation circuit shown in the amplifier of FIG. 2.
Figure 8:
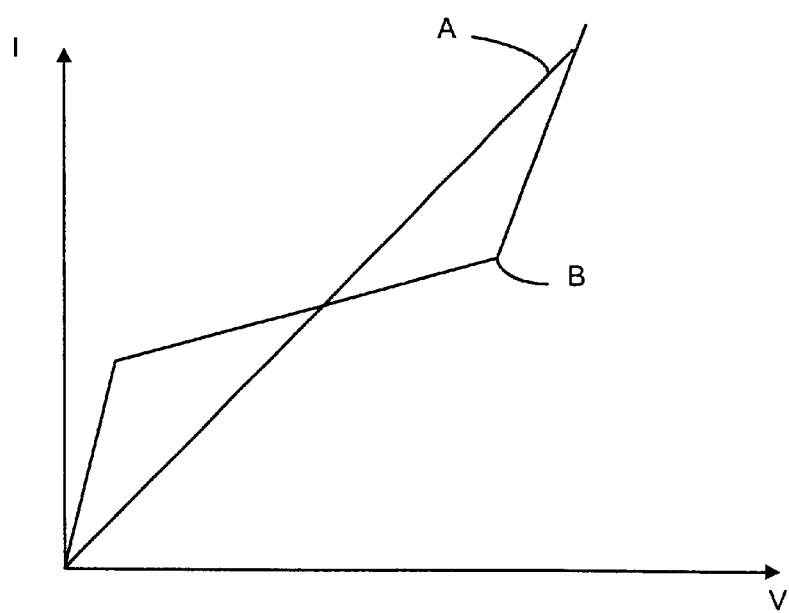
FIG. 8 is a plot of current versus voltage for the resistor of FIG. 3 and for the impedance in the thermal gain versus control current shown in FIG. 5.

A plot of the impedance for the amplifier thermal gain control circuit 330 is shown in FIG. 8 and is labeled B. As shown in this Figure, the impedance varies with the referenced voltage and, in this example, has three distinct regions. The first region is selected to correspond with a range of control currents in which the gain shown in FIG. 6 is above a plot A for the single resistor shown in FIG. 3. In this first region, the amplifier thermal gain control circuit 330 provides an impedance which is greater than the single resistor. In comparison to the single resistor, the thermal compensation circuit 320 reduces the magnitude of the control current, thereby decreasing the gain of the amplifier 325.

A second region of the impedance is selected to correspond with a range of currents in which the gain is at a relatively fixed slope. The impedance in this second region is less than the single resistor and therefore increases the control current and thus gain of the amplifier 325. The third and final region of the amplifier thermal gain control circuit 330 has a greater resistance than the single resistor and thus decreases the magnitude of the control current.

Figure 9:
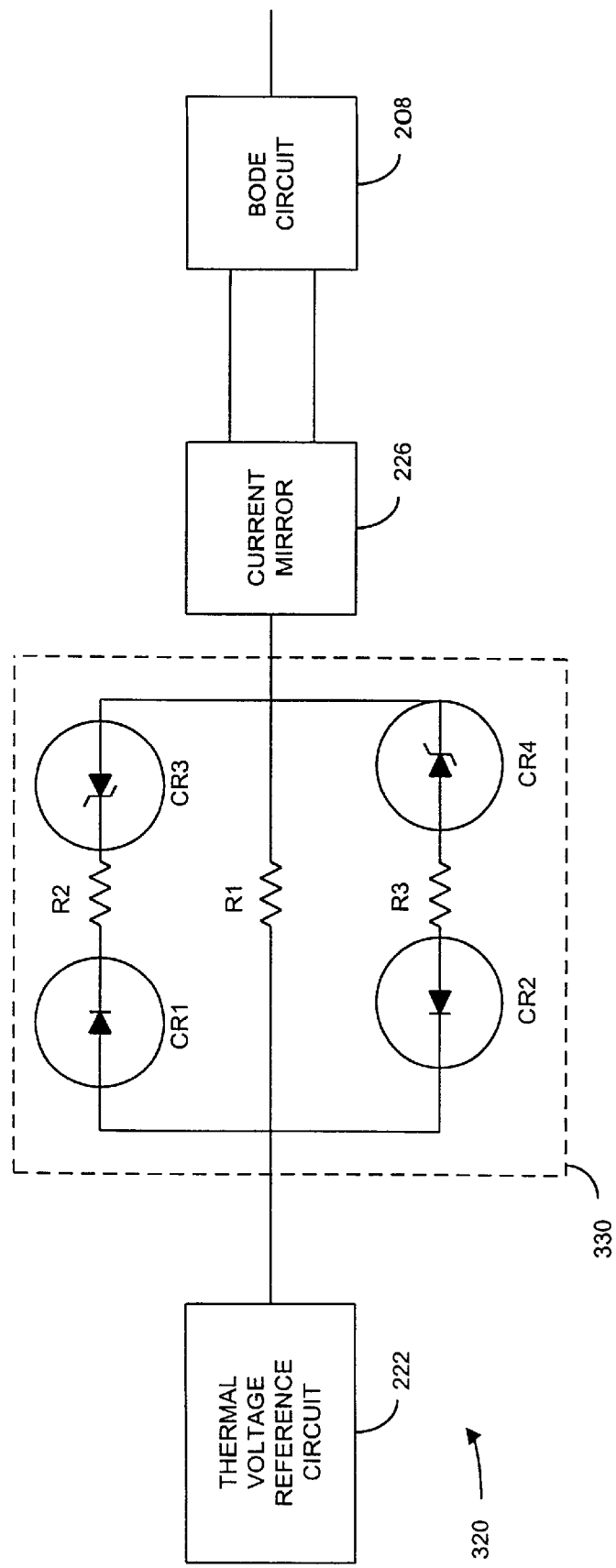
FIG. 9 is an example of a preferred thermal gain control circuit for use in the thermal compensation circuit of FIG. 7.

A preferred embodiment of the amplifier thermal gain control circuit 330 is shown in FIG. 9. The amplifier thermal gain control circuit 330 includes a plurality of circuit paths that are selectively switched according to the reference voltage, and thus temperature. Each of the circuit paths has an impedance which, together with the other circuit paths that are switched on, control the magnitude of the control current. In the example shown in FIG. 9, the amplifier thermal gain control circuit 330 presents three different impedances throughout the range of reference voltages. In this example, resistor R1 has a value of 1 kΩ and resistors R2 and R3 each has a value of 0.25 kΩ. The Zener diodes and PIN diodes control the switching so that R1 and R3 present the impedance from 0 to 5 volts, R1 presents the impedance from 5 to 10 volts, and R1 and R2 present the impedance from 10 to 15 volts.

A plot of the control voltage versus Bode gain is shown in FIG. 10. As represented by the plot labeled with diamonds, the prior relationship with Bode gain and control voltage is non-linear. As discussed above, this non-linearity was due in part to the non-linear relationship between the Bode gain and the control current. In contrast, the plot labeled with squares has a markedly more linear relationship between the Bode gain and the control voltage. Overall, the more linear response of the Bode circuit 208 results in a significant improvement in the ability of the amplifier 325 to maintain its output power at a constant level throughout the operating range of temperatures.

The forgoing description of the preferred embodiments of the invention has been presented only for the purpose of illustration and description and is not intended to be exhaustive or to limit the invention to the precise forms disclosed. Many modifications and variations are possible in light of the above teaching.

In the preferred embodiment, the plot of the Bode gain versus control current is divided into three regions and the amplifier thermal gain control circuit presents three different impedances in those three regions. The invention is not limited to the use of just three regions or just three impedances but incorporates the use of at least two regions and two impedances. Further, while the invention has been described with reference to an amplifier in a cable distribution system, it should be understood that the invention can be applied to any amplifier and to any communication system.

The embodiments were chosen and described in order to explain the principles of the invention and their practical application so as to enable others skilled in the art to utilize the invention and various embodiments and with various modifications as are suited to the particular use contemplated.

What is claimed:

1. An amplifier, comprising:
   a gain stage for amplifying an input signal and for providing an output signal;
   a variable attenuator for adjusting a power level of the output signal based on a control signal, the variable attenuator having a non-linear relationship between its gain and the control signal;
   a temperature circuit for providing a temperature reference signal to the variable attenuator, the temperature reference signal providing an indication of an ambient temperature; and
   a compensation circuit for receiving the temperature reference signal and for generating the control signal;
   wherein the compensation circuit having a plurality of impedances generates the control signal for providing a complementary current signal that has a non-linear relationship with temperature to offset the non-linear relationship of the variable attenuator, whereby an overall response of the amplifier is substantially linear with temperature.

2. The amplifier as set forth in claim 1, wherein the control signal is a current signal.

3. The amplifier as set forth in claim 1, wherein the temperature reference signal is a voltage signal.

4. The amplifier as set forth in claim 1, wherein the temperature reference circuit is a voltage signal, the control signal is a current signal, and the compensation circuit converts the voltage signal into the current signal.

5. The amplifier as set forth in claim 1, wherein the attenuator provides its output to a second gain stage.

6. The amplifier as set forth in claim 1, wherein an impedance of the compensation circuit varies with a magnitude of the temperature reference signal.

7. The amplifier as set forth in claim 1, wherein the variable attenuator is a Bode circuit.

8. An amplifier for use in a communication system, comprising:
   a gain stage for amplifying an input signal and for providing an output signal;
   a variable attenuator for attenuating the output signal so that a power level of the amplifier remains relatively constant, a gain of the variable attenuator having a non-linear relationship with temperature;
   a thermal compensation circuit for providing a control signal to the variable attenuator, the control signal for adjusting the gain of the variable attenuator based on temperature;
   wherein the thermal compensation circuit having a plurality of impedances generates the control signal for providing a complementary current signal that has a non-linear relationship with temperature to offset the non-linear relationship between the gain of the variable attenuator and temperature so that the power level of the output signal remains relatively constant over an operating ranges of temperatures.

9. The amplifier as set forth in claim 8, wherein the variable attenuator is a Bode circuit.

10. The amplifier as set forth in claim 8, wherein the variable attenuator provides its output to a second gain stage.

11. The amplifier as set forth in claim 8, wherein the control signal is a current signal, the temperature reference signal is a voltage signal, and the thermal compensation circuit converts the voltage signal into the current signal.

12. The amplifier as set forth in claim 8, wherein the plurality of impedances are in parallel to each other, a set of the impedances being presented in circuit with the temperature reference signal based on a magnitude of the temperature reference signal.

13. The amplifier as set forth in claim 12, wherein the impedances are resistive.

14. The amplifier as set forth in claim 12, wherein a first impedance is presented in a first range of magnitudes for the temperature reference signal, the first impedance and a second impedance are presented during a second range, and the first impedance and a third impedance are presented during a third range.

15. The amplifier as set forth in claim 12, wherein a Zener diode and a PIN diode are connected in series with one of the impedances and switch the one impedance into the circuit at a predetermined magnitude of the temperature reference signal.

16. A communication system, comprising:
   a transmission system for providing a signal; and
   an amplifier coupled to the transmission system for amplifying the signal, the amplifier comprising:
      a gain stage for amplifying an input signal and for providing an output signal;
      a variable attenuator for attenuating the output signal so that a power level of the amplifier remains relatively constant, a gain of the variable attenuator having a non-linear relationship with temperature;

a thermal compensation circuit for providing a control signal to the variable attenuator, the control signal for adjusting the gain of the variable attenuator based on temperature;

wherein the thermal compensation circuit having a plurality of impedances generates the control signal for providing a complementary current signal that has a non-linear relationship with temperature to offset the non-linear relationship between the gain of the variable attenuator and temperature so that the power level of the output signal remains relatively constant over an operating ranges of temperatures.

17. The communication system as set forth in claim 16, wherein the communication system comprises a cable television system.

18. The communication system as set forth in claim 16, wherein the transmission system comprises headend equipment.

19. The communication system as set forth in claim 16, wherein the variable attenuator comprises a Bode circuit.

20. The communication system as set forth in claim 16, wherein the temperature reference signal comprises a voltage signal, the control signal is a current signal, and the thermal compensation circuit converts the temperature signal into a current signal.

* * * * *